(12) United States Patent
Hayamizu

(10) Patent No.: US 6,583,036 B1
(45) Date of Patent: Jun. 24, 2003

(54) METHOD OF MANUFACTURING A SEMICONDUCTOR DEVICE

(75) Inventor: Taichi Hayamizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/141,922

(22) Filed: May 10, 2002

(30) Foreign Application Priority Data

Dec. 17, 2001 (JP) ........................................ 2001-383490

(51) Int. Cl.[7] ................ H01L 21/3205; H01L 21/4763; H01L 21/302; H01L 21/461
(52) U.S. Cl. ..................... 438/585; 438/692; 438/719
(58) Field of Search ................ 438/585, 692, 438/719, 723, 221, 693

(56) References Cited

U.S. PATENT DOCUMENTS 5,412,246 A * 5/1995 Dobuzinsky et al. ....... 257/632
5,962,879 A * 10/1999 Ryum et al. ................ 257/198
6,060,394 A * 5/2000 Wu ............................. 438/692
6,157,063 A * 12/2000 Iiboshi ....................... 257/344
6,337,494 B1 * 1/2002 Ryum et al. ................ 257/197

FOREIGN PATENT DOCUMENTS

JP 2001-237420 8/2001

* cited by examiner

*Primary Examiner*—John F. Niebling
*Assistant Examiner*—Walter L. Lindsay, Jr.
(74) *Attorney, Agent, or Firm*—Burns, Doane, Swecker & Mathis, LLP

(57) ABSTRACT

On a substrate, a gate insulating film, a polysilicon film on the gate insulating film, and a resist pattern on the polysilicon film are formed. Subsequently an exposed portion of the polysilicon film which is not covered with the resist pattern is removed. The surface of the polysilicon film left after the step of removing the exposed portion of the polysilicon film is thermally oxidized to form a gate electrode and an insulating film simultaneously on the surface of the gate electrode.

1 Claim, 7 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device provided with a fine gate electrode.

2. Background Art

In recent years, in order to attain a high degree of integration of a semiconductor device, there is an increasing demand of forming a fine gate electrode of a transistor serving as a semiconductor element.

In FIGS. 3A to 3E, a conventional method of manufacturing a semiconductor device is briefly described. FIGS. 3A to 3E are schematic sectional views showing a semiconductor device in the respective steps of forming a gate electrode.

Initially, as shown in FIG. 3A, a gate insulating film 2 is formed on a silicon substrate 1.

Next, as shown in FIG. 3B, a polysilicon film 3 is formed on the gate insulating film 2. It will be noted here that part of the thus formed polysilicon film 3 becomes a gate electrode in a subsequent step.

Thereafter, as shown in FIG. 3C, a photoresist 4 is applied onto the polysilicon film 3.

As shown in FIG. 3D, a desired resist pattern 4a is formed on the polysilicon film 3 according to photolithography.

Next, as shown in FIG. 3E, an exposed portion of the polysilicon film 3, which is not covered with the resist pattern 4a, is etched via a mask of the resist pattern 4a. Moreover, the resist pattern 4a is removed to form a polysilicon film 3a serving as a gate electrode on the gate insulating film 2.

In the above-stated conventional method of manufacturing a semiconductor device, the scale down of the gate electrode relies on the resolution in a lithographic technique. More particularly, the gate length of the gate electrode becomes substantially same as the line width of the resist pattern formed according to the photolithography. This entails that a possible minimum gate length depends just on the resolution of an exposure equipment used in the photolithography.

The resolution of an exposure equipment is proportional to a wavelength of light from a light source. Hence, for further scale down of the gate electrode, it is essential to use an exposure equipment having a shorter wavelength light source. Nevertheless, certain limitation is placed on the realization of such a shorter wavelength of a light source, so that it has been difficult to form a fine gate electrode at a level below resolution.

To solve the above problem, the following technique is disclosed, for example, in JP-A No. 2001-237420. More particularly, a gate insulating film, a first polysilicon film, a nitride film and a second polysilicon film are successively formed on a semiconductor substrate, followed by forming a pattern of the second polysilicon according to photolithography. Thereafter, the second polysilicon pattern is thermally oxidized on the surface thereof, and the resulting thermal oxidation film is removed to form a finer second polysilicon film.

Thereafter, using the fine second polysilicon pattern as a mask, an exposed portion of the underlying nitride film is removed. The exposed portion of the first silicon film and the fine second polysilicon pattern are both removed via a mask of a remaining nitride film, thereby forming a gate electrode made of the fine first polysilicon film.

The method of manufacturing a semiconductor device as stated hereinabove has the problem that although a fine gate electrode can be formed irrespective of the resolution of photolithography, a number of the manufacturing steps are used and complicated.

SUMMARY OF THE INVENTION

The present invention is provided in order to solve the above-stated problem and contemplates to provide a method of manufacturing a semiconductor device wherein a fine gate electrode can be relatively simply formed without resorting to the resolution in a photolithographic technique.

In one embodiment of the present invention, the method comprises these steps below. A gate insulating film is formed on a substrate, a polysilicon film is formed on the gate insulating film, a resist pattern is formed on the polysilicon film and subsequently an exposed portion of the polysilicon film which is not covered with the resist pattern is removed. Subsequently, the surface of the polysilicon film left after the step of removing the exposed portion of the polysilicon film is thermally oxidized to simultaneously form a gate electrode and an insulating film on the surface of the gate electrode. After the step of simultaneously forming the gate electrode and the insulating film on the surface of the gate electrode, the insulating film on the surface of the gate electrode may be formed with a hole at part thereof.

In another embodiment of the present invention, the method comprises these steps below. A gate insulating film is formed on a substrate, a polysilicon film is formed on the gate insulating film, and a nitride film is formed on the polysilicon film. Next a resist pattern is formed on the nitride film and subsequently an exposed portion of the nitride film which is not covered with the resist pattern is removed, thereby forming a nitride film pattern. Next the exposed portion of the polysilicon film which is not covered with the nitride film pattern is removed. The surface of the polysilicon film left after the step of removing the exposed portion of the polysilicon film is thermally oxidized to simultaneously form a gate electrode and an insulating film on side surfaces of the gate electrode. A silicide is formed on the upper surface of the gate electrode through the insulating film on side surfaces on the gate electrode used as a mask.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

Figure 1A:
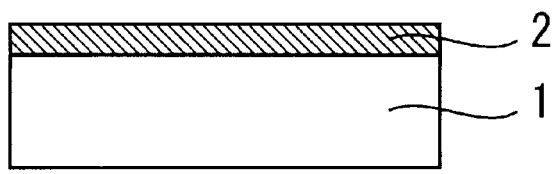
FIGS. 1A to 1F are schematic sectional views showing a semiconductor device in the respective steps of forming a gate electrode in a method of manufacturing the semiconductor device according to the first embodiment of the invention.

Embodiments of the invention will be described in detail with reference to the accompanying drawings. It will be noted in the figures, the same reference numerals indicate the same members or portions and the repetition of their explanation may be appropriately simplified or may be omitted.

In FIGS. 1A to 1F, a first embodiment of the invention will be described in detail. FIGS. 1A to 1F are, respectively, schematic sectional views showing a semiconductor device in the respective steps of forming a gate electrode in a method of manufacturing the semiconductor device according to the first embodiment of the invention.

As shown in FIG. 1A, a gate insulating film is formed on a silicon substrate 1. The gate insulating film 2 has a thickness, for example, of 3 nm.

Figure 1B:
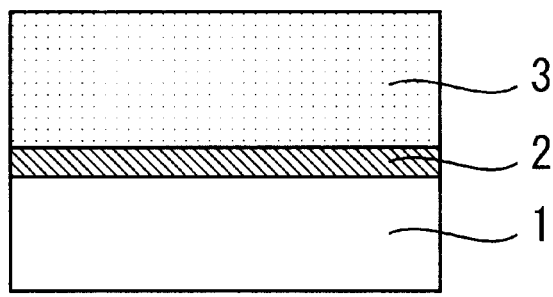

Next, as shown in FIG. 1B, a polysilicon film 3 is formed on the gate insulating film 2 according to a CVD method. It will be noted that part of the polysilicon film 3 becomes a gate electrode in a subsequent step, with the thickness thereof being, for example, at 20 nm.

Figure 1C:
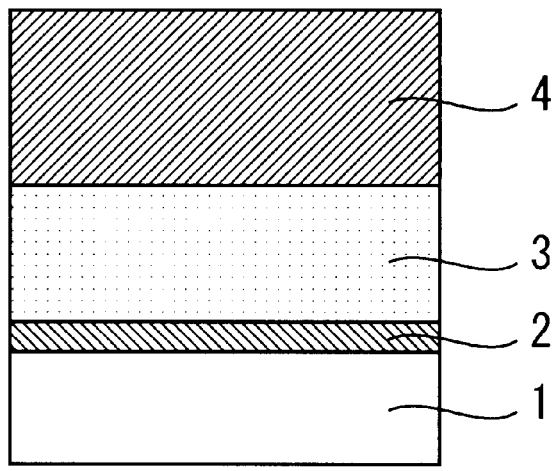

Thereafter, as shown in FIG. 1C, a photoresist film 4 is applied onto the polysilicon film 3.

Figure 1D:
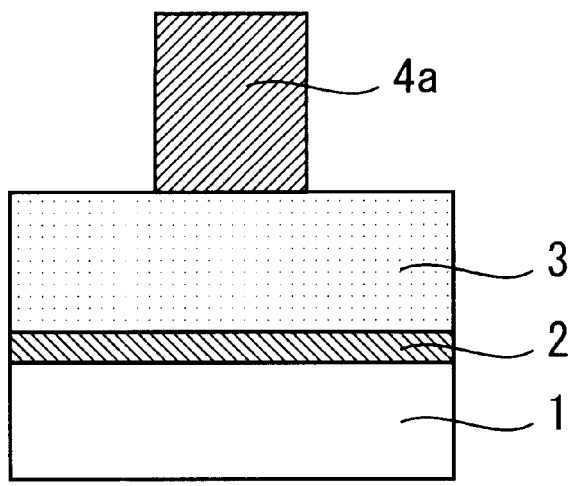

Further, as shown in FIG. 1D, a desired resist pattern 4a is formed by photolithography.

Figure 1E:
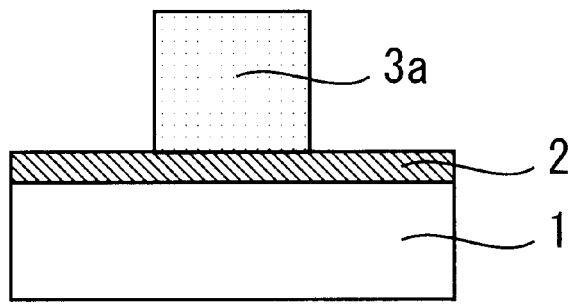

Next, as shown in FIG. 1E, an exposed portion of the polysilicon film 3, which is not covered with the resist pattern 4a, is removed by dry etching through the resist pattern 4a used as a mask. In this way, a polysilicon film 3a is formed as a polysilicon pattern. Moreover, the resist pattern 4a on the polysilicon film 3a is removed by ashing.

Figure 1F:
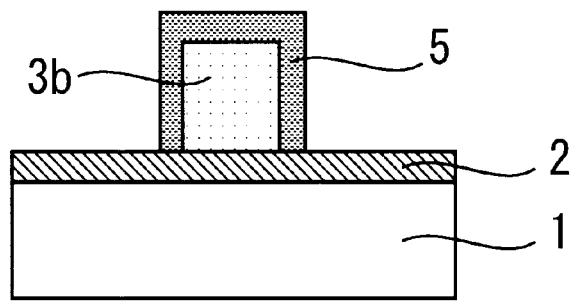

As shown in FIG. 1F, the polysilicon film 3a is thermally oxidized to form a thermal oxide film 5 as an insulating film on the surfaces of the polysilicon pattern (including an upper surface and side surfaces of the polysilicon film 3a). At this stage, the inside of the polysilicon pattern does not undergo any thermal oxidation and remains as a polysilicon film 3b. This polysilicon film 3b serves as a gate electrode.

More particularly, in the first embodiment of the invention, the gate electrode 3b and the insulating film 5 surrounding the electrode are simultaneously formed by the thermal oxidation treatment of the polysilicon film 3a. The polysilicon film 3b serving as the gate electrode has a width (gate length) which is more reduced by twice the thickness of the thermal oxide film 5 than a width of the polysilicon film 3a prior to the step of the thermal oxidation treatment.

As stated hereinabove, the insulating films made of the thermal oxide film 5 and the gate insulating film 2 are formed on the silicon substrate 1. More particularly, the thermal oxide film 5 serving as an insulating film is not removed in subsequent steps and left, as it is, as an insulating film in the semiconductor device. In other words, according to the method of manufacturing a semiconductor device in the first embodiment of the invention, to leave the thermal oxide film as an insulating film permits a subsequent insulating film-forming step to be omitted.

Although not shown in the figures, after the steps described above, the thermal oxide film 5 is formed with a hole at a part of the upper surface thereof so that a part at the upper surface of the polysilicon film 3b is exposed. Moreover, a plug such as tungsten is formed in the hole. In this way, a transistor of the semiconductor device is formed. It will be noted that the source/drain regions of the transistor are neither particularly shown nor illustrated.

As set forth hereinabove, in the method of manufacturing the semiconductor device in the first embodiment of the invention, a fine gate electrode can be formed according to a relatively small number of steps without resorting to the resolution in the photolithographic technique.

Second Embodiment

With reference to FIGS. 2A to 2J, the second embodiment of the invention will be described in detail. FIGS. 2A to 2J are, respectively, schematic sectional views showing a semiconductor device in the respective steps of forming a gate electrode in a method of manufacturing the semiconductor device according to the second embodiment of the invention.

Figure 2A:
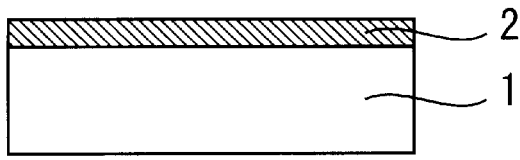
FIGS. 2A to 2J are, respectively, schematic sectional views showing a semiconductor device in the respective steps of forming a gate electrode in a method of manufacturing the semiconductor device according to the second embodiment of the invention.

Initially, as shown in FIG. 2A, a gate insulating film 2 is formed on a silicon substrate 1. The thickness of the gate insulating film 2 is, for example, at 3 nm.

Figure 2B:
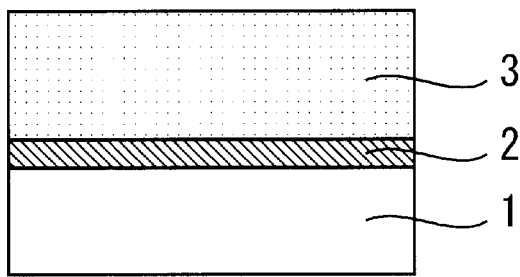

Next, as shown in FIG. 2B, a polysilicon film 3 is formed on the gate insulating film 2 according to a CVD method. It will be noted that part of this polysilicon film 3 becomes a gate electrode in a subsequent step, with the film thickness being, for example, at 20 nm.

Figure 2C:
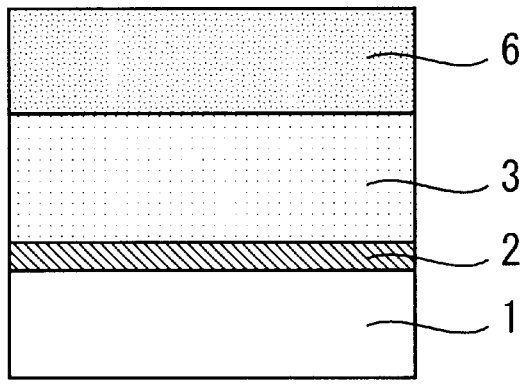

As shown in FIG. 2C, a nitride film is formed on the polysilicon film 3 according to a CVD method. The thickness of the nitride film is, for example, at 15 nm.

Figure 2D:
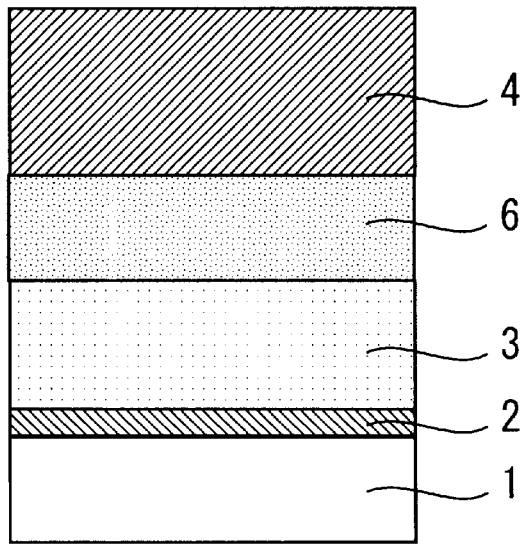

Thereafter, as shown in FIG. 2D, a photoresist film 4 is coated onto the nitride film 6.

Figure 2E:
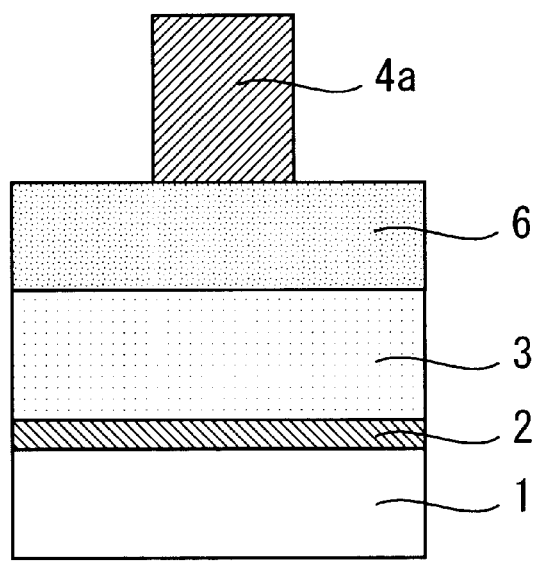

As shown in FIG. 2E, a desired resist pattern 4a is formed according to photolithography.

Figure 2F:
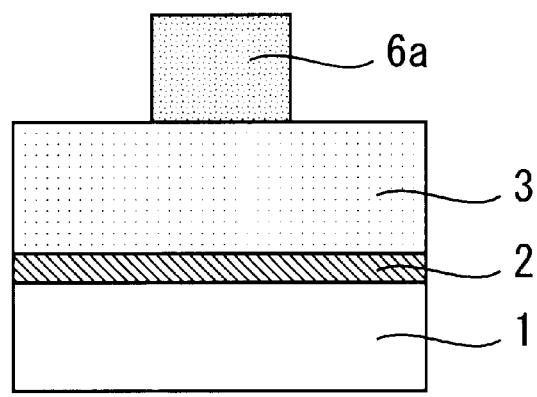

Next, as shown in FIG. 2F, an exposed portion of the nitride film 6, which is not covered with the resist pattern 4a, is removed by drying etching through a mask of the resist pattern 4a. As a result, a nitride film pattern 6a is formed. Moreover, the resist pattern 4a on the nitride film pattern 6a is removed.

Figure 2G:
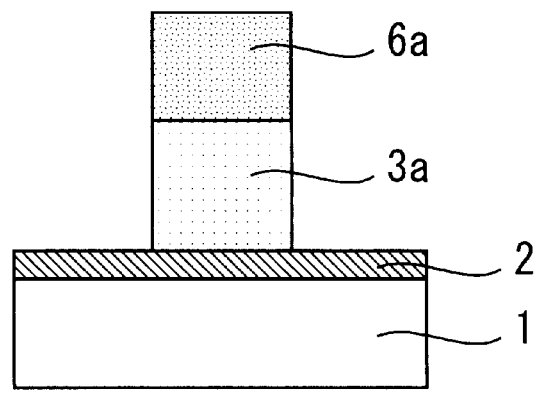

Next, as shown in FIG. 2G, an exposed portion of the polysilicon film 3, which is not covered with the resist pattern 4a, is removed by dry etching through the resist pattern 6a used as a mask. In this way, a polysilicon film 3a is formed as a polysilicon pattern.

Figure 2H:
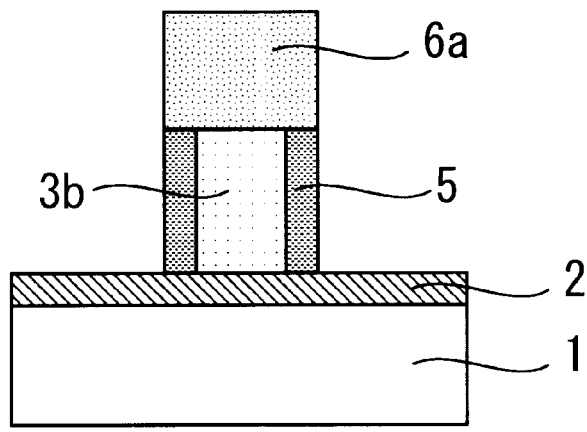

As shown in FIG. 2H, the polysilicon film 3a is thermally oxidized thereby forming a thermal oxide film 5, as an insulating film, on the exposed surfaces of the polysilicon pattern (i.e. the side surfaces of the polysilicon film 3a). At this stage, the inside of the polysilicon pattern is left as a polysilicon film 3b, like the above-stated first embodiment, and this polysilicon film 3b serves as a gate electrode.

More particularly, in the second embodiment, the gate electrode 3b and the insulating film 5 on the side surfaces of the gate electrode are simultaneously formed through the thermal oxidation treatment of the polysilicon film 3a.

Figure 2I:
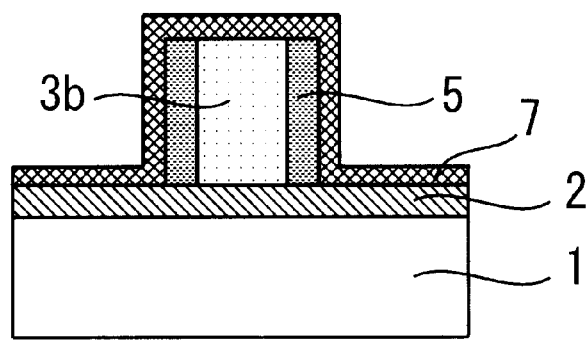

Next, as shown in FIG. 2I, after removal of the nitride film pattern 6a on the polysilicon film 3b, a metal film 7 such as cobalt is formed on an exposed surface of each of the gate insulating film 2, polysilicon film 3b and thermal oxide film 5. The metal film 7 has a thickness, for example, of 7 nm.

Figure 2J:
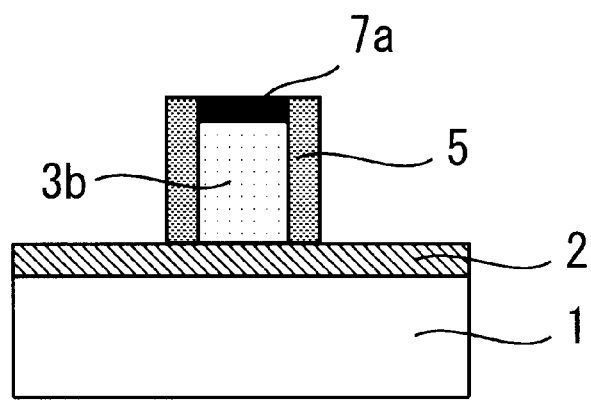
Figure 3A:
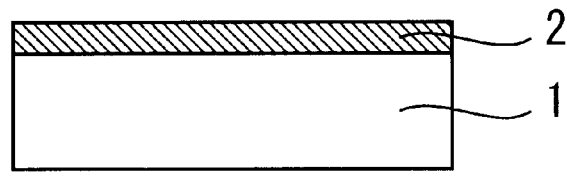
FIGS. 3A to 3E are schematic sectional views showing a semiconductor device in the respective steps of forming a gate electrode in a conventional method of manufacturing a semiconductor device.
Figure 3B:
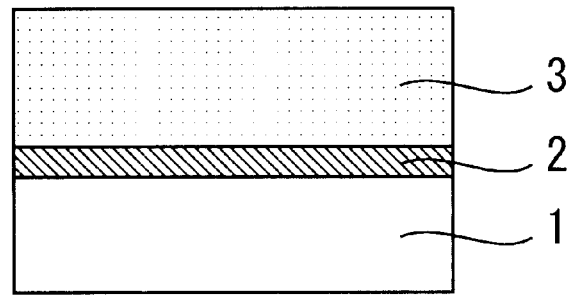
Figure 3C:
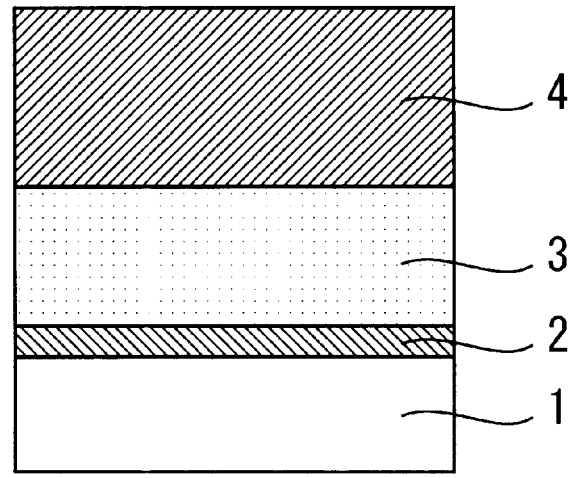
Figure 3D:
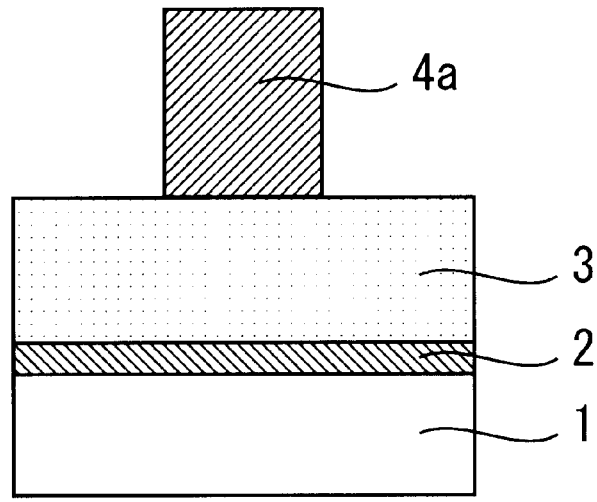
Figure 3E:
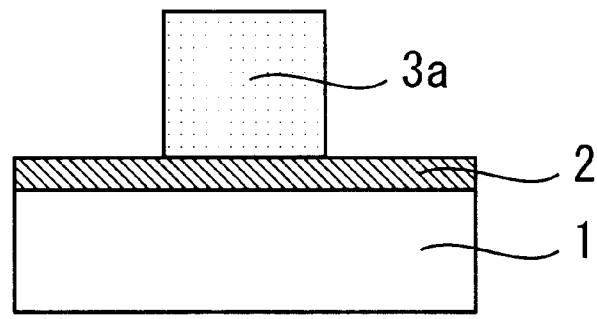

Thereafter, annealing is carried out, whereupon a silicide 7a is formed only at a contact portion between the metal film 7 and the polysilicon film 3b through a mask of the thermal oxide film 5. At the same time, the other portion of the metal film 7 where no silicide 7a is formed is removed as shown in FIG. 2J.

In this manner, the silicide 7a formed with the metal film can be selectively formed on the polysilicon film 3b serving as a fine gate electrode. It will be noted that the silicide 7a lowers the resistance of the gate electrode thereby improving the performance of a transistor.

As stated hereinabove, the silicon substrate 1 is formed thereon with the insulating film made of the thermal oxide film 5 and the gate insulating film 2 except for the upper surface of the gate electrode. More particularly, the thermal oxide film 5 formed on the side surfaces of the polysilicon film 3b serving as an insulating film is left, as it is, as an insulating film in subsequent steps without removal thereof. Moreover, the thermal oxide film 5 formed on the side surfaces of the polysilicon film 3b serves as a mask, enabling the formation of the silicide 7a on the upper surface of the polysilicon film 3b.

Although not shown, after the above step, an insulating film is formed on the upper surface of the silicide 7a or over the entire region of the silicon substrate 1 including the upper surface of the silicide 7a. Thereafter, the insulating film on the silicide 7a is formed with a hole in part thereof according to photolithography so that part of the upper surface of the silicide 7a is exposed. A plug is formed in the hole.

As set forth hereinabove, according to the method of manufacturing a semiconductor device in the second embodiment of the invention, a fine, low resistance gate electrode can be formed by a relatively small number of steps without resorting to the resolution in a photolithographic technique, like the foregoing first embodiment.

It should be noted that the invention should not be construed as limited to these embodiments and appropriate variations and alterations of the embodiments may be possible within the spirit of the technical concept of the invention except those suggested in the embodiments. The number, position, shape and the like of constituting members are not limited to those indicated in the embodiments, but such a number, position and shape may be appropriately determined from the standpoint of carrying out the invention.

The invention is so arranged as described hereinbefore and can provide a method of manufacturing a semiconductor device wherein a fine gate electrode can be relatively simply formed without resorting to the resolution in a photolithography.

The entire disclosure of a Japanese Patent Application No. 2001-0383490, filed on Dec. 17, 2001 including specification, claims drawings and summary, on which the Convention priority of the present application is based, are incorporated herein by reference in its entirety.

What is claimed is:

1. A method of manufacturing a semiconductor device, comprising the steps of:

forming a gate insulating film on a substrate;

forming a polysilicon film on said gate insulating film;

forming a nitride film on said polysilicon film;

forming a resist pattern on said nitride film and subsequently removing an exposed portion of said nitride film which is not covered with said resist pattern, thereby forming a nitride film pattern;

removing the exposed portion of said polysilicon film which is not covered with said nitride film;

thermally oxidizing the surface of said polysilicon film left after the step of removing the exposed portion of said polysilicon film to simultaneously form a gate electrode and an insulating film on said surfaces of said gate electrode;

removing the nitride film pattern on the upper surface of said gate electrode; and forming a silicide on the upper surface of said gate electrode through the insulating film on side surfaces on said gate electrode used as a mask after removing the nitride film pattern.

* * * * *